United States Patent
Pruneri et al.

(10) Patent No.: US 8,623,153 B2
(45) Date of Patent: Jan. 7, 2014

(54) METHOD TO PREPARE A STABLE TRANSPARENT ELECTRODE

(75) Inventors: Valerio Pruneri, Barcelona (ES); Luis Martinez Montblanch, Barcelona (ES); Stefano Giurgola, Sesto Florentino (IT); Paolo Vergani, Vimercate (IT)

(73) Assignee: Fundacio Institut de Ciencies Fotoniques, Castelldefels, (Barcelona) (ES)

( * ) Notice: Subject to any disclaimer, the term of this patent is extended or adjusted under 35 U.S.C. 154(b) by 280 days.

(21) Appl. No.: 12/997,011

(22) PCT Filed: Jun. 10, 2009

(86) PCT No.: PCT/EP2009/057148
§ 371 (c)(1),
(2), (4) Date: Dec. 9, 2010

(87) PCT Pub. No.: WO2009/150169
PCT Pub. Date: Dec. 17, 2009

(65) Prior Publication Data
US 2011/0114226 A1 May 19, 2011

(30) Foreign Application Priority Data
Jun. 10, 2008 (EP) .................................. 08157959

(51) Int. Cl.
*H01L 31/0224* (2006.01)
*C23C 8/10* (2006.01)

(52) U.S. Cl.
USPC 148/284; 427/77; 257/E33.064; 257/E31.126

(58) Field of Classification Search
USPC ............................................. 148/284; 427/77
See application file for complete search history.

(56) References Cited

U.S. PATENT DOCUMENTS

| | | | |
|---|---|---|---|
| 6,391,724 B1 * | 5/2002 | Park ............................... | 438/279 |
| 6,602,606 B1 | 8/2003 | Fujisawa et al. .............. | 428/432 |
| 2002/0146599 A1 | 10/2002 | Cheung ......................... | 428/701 |
| 2003/0057495 A1 | 3/2003 | Gong et al. .................... | 257/352 |
| 2003/0107098 A1 | 6/2003 | Ota et al. ....................... | 257/436 |
| 2003/0218153 A1 | 11/2003 | Abe ............................... | 252/500 |
| 2006/0163567 A1 * | 7/2006 | Park et al. ...................... | 257/43 |

OTHER PUBLICATIONS

S. Guirgola et al., "Ultra thin nickel transparent electrodes", *J. Mater Sci: Mater Electron*, Aug. 10, 2007.

C.A. Smith, "A review of liquid crystal display technologies, electronic interconnection and failure analysis", *Circuit World*, 34/1:35-41 (2008).

J.K. Kim et al., "GaN MSM Ultraviolent Photodetectors with Transparent and Thermally Stable $RuO_2$ and $IrO_2$ Schottky Contacts", *Journal of the Electrochemical Society*, 151(3):G190-G195 (2004).

(Continued)

*Primary Examiner* — Lois Zheng
(74) *Attorney, Agent, or Firm* — Ostrolenk Faber LLP

(57) ABSTRACT

The present application discloses a method for producing a stable ultra thin metal film that comprises the following steps: a) deposition, on a substrate, of an ultra thin metal film, such as an ultra thin film of nickel, chromium, aluminum, or titanium; b) thermal treatment of the ultra thin metal film, optionally in combination with an $O_2$ treatment; and c) obtaining a protective oxide layer on top of the ultra thin metal film.

16 Claims, 3 Drawing Sheets

(56) References Cited

OTHER PUBLICATIONS

Y. Chiou et al., "GaN Photodetectors with Transparent Indium Tin Oxide Electrodes", *Japanese Journal of Applied Physics*, 43(7a):4146-4149 (2004).

C.M. Gee et al., "Minimizing dc drift in $LiNbO_3$ waveguide devices" *Appl. Phys. Lett.*, 47(3):211-213 (1985).

S. Conoci et al., "Optically Transparent, Ultrathin Pt Films as Versatile Metal Substrates for Molecular Optoelectronics", *Adv. Funct. Mater.*, 16:1425-1432 (2006).

R.B. Pode et al., "Transparent conducting metal electrode for top emission organic light-emitting devices: Ca-Ag double layer", *Applied Physics Letters*, 84(23):4614-4616 (2004).

H. Yang et al., "Optimized thickness of superconducting aluminum electrodes for measurement of spin polarization with MgO tunnel barriers", *Applied Physics Letters*, vol. 90 (2007).

J.J. Qiu et al., "The influence of nano-oxide layer on magnetostriction of sensing layer in bottom spin valve", *Journal of Applied Physics*, vol. 99 (2006).

M.S. Chen et al., "Ultrathin, ordered oxide films on metal surfaces", *Journal of Physics Condensed Matter*, 20:1-11 (2008).

U. Mitschke et al., "The electroluminescence of organic materials", *J. Mater. Chem.*, 10:1471-1507 (2000).

C.G. Granqvist, "Transparent conductors as solar energy materials: A panoramic view", *Solar Energy Materials & Solar Cells*, 91:1529-1590 (2007).

S. Giurgola et al., "Ultra thin metal films as an alternative to TCOs for optoelectronic applications", *Il Nuevo Cimento*, pp. 1-12.

Chinese Office Action dated Jul. 3, 2013 issued in corresponding Chinese Application No. 200980128591.8 (with partial English translation).

* cited by examiner

METHOD TO PREPARE A STABLE TRANSPARENT ELECTRODE

CROSS REFERENCE TO RELATED APPLICATIONS

The present application is a 35 U.S.C. §371 National Phase conversion of PCT/EP2009/057148, filed Jun. 10, 2009, which claims benefit of European application No. 08157959.1, filed Jun. 10, 2008, the disclosure of which is incorporated herein by reference. The PCT International Application was published in the English language.

FIELD OF THE INVENTION

The present invention relates to optically transparent and electrically conductive metal electrodes based on ultra thin metal films (UTMFs) for optoelectronic applications.

BACKGROUND OF THE INVENTION

Transparent electrodes, i.e. films which can conduct electricity and at the same time transmit light, are of crucial importance for many optical devices, such as photovoltaic cells [Claes G. Granqvist "Transparent conductors as solar energy materials: A panoramic review" Solar Energy Materials & Solar Cells 91 (2007) 1529-1598], organic light emitting diodes [Ullrich Mitschke and Peter Bäuerle, "The electroluminescence of organic materials" J. Mater. Chem., 2000, 10, 1471], integrated electro-optic modulators [CM Lee et al., "Minimizing DC drift in $LiNbO_3$ waveguide devices", Applied Physics Lett. 47, 211 (1985)], laser displays [C. A. Smith "A review of liquid crystal display technologies, electronic interconnection and failure analysis Circuit" World Volume 34•Number 1•2008•35-41], photo-detectors, etc. [Yu-Zung Chiou and Jing-Jou TANG "GaN Photodetectors with Transparent Indium Tin Oxide Electrodes" Japanese Journal of Applied Physics Vol. 43, No. 7A, 2004, pp. 4146-4149]. From an application point of view, besides large optical transparency in the wavelength range of interest and adequate electrical conductivity, transparent electrodes should possess other key features, such as easy processing (e.g. possibility for large scale deposition), compatibility with other materials that form the same device (e.g. active layers), stability against temperature, mechanical and chemical stress, and low cost.

So far, transparent electrodes have been mainly fabricated using Transparent Conductive Oxides (TCOs), i.e. wide band gap semiconductors with heavy doping. Among them, Indium Tin Oxide (ITO) is the most widely used. Despite possessing large electrical conductivity and optical transparency from the visible to the infrared, TCOs present several drawbacks such as the requirement of high temperature (several hundreds of ° C.) post deposition treatments to improve mainly their electrical properties, their strong electrical and optical dependence on the doping control and their multicomponent structure that can lead to incompatibilities with some active materials. In addition they are not transparent in the UV range as it is shown in FIG. 1, which might be relevant for several applications. Often, such as in the case of ITO, they are made of elements (In) which are not easily available in large quantities and thus expensive.

Accordingly, providing a different type of transparent electrode that overcomes the aforementioned drawbacks is being investigated.

For instance R. B. Pode, et. al. ("Transparent conducting metal electrode for top emission organic light-emitting devices: Ca—Ag double layer", Appl. Phys. Lett. 84, 4614 (2004), DOI:10.1063/1.1756674) propose a composite ultra thin metal electrode made of calcium and silver. Since the Ca is extremely sensitive to atmospheric moisture and oxygen, the metal was then protected by a layer of Ag. In fact in that reference it is said that also a double layer structure of Ca—Al has been tried for the purpose of reaching stability but the Al layer seems to be unable to protect the Ca layer from oxidation.

Annealing treatment has also been performed on Pt polycrystalline metal films to induce a structural change and promote a (111) texture [Sabrina Conoci, Salvatore Petralia, Paolo Samorì, Francisco M. Raymo, Santo Di Bella, and Salvatore Sortino "Optically Transparent, Ultrathin Pt Films as Versatile Metal Substrates for Molecular Optoelectronics" Advanced Functional Materials Volume 16, Issue 11, Pages 1425-1432]. As a consequence the metal films increase their electrical conductivity while the optical transparency does not change significantly. No oxide formation is reported, probably due to the noble nature of the metal.

Oxidation of Ru and Ir thin metal layers has been carried out at high temperatures to produce stable thin films of ruthenium oxide ($RuO_2$) and iridium oxide ($IrO_2$) [Jong Kyu Kim and Jong-Lam Lee "GaN MSM Ultraviolet Photodetectors with Transparent and Thermally Stable $RuO_2$ and $IrO_2$ Schottky Contacts" Journal of The Electrochemical Society, 151 (3) G190-G195 (2004)]. The resulting conducting metal oxides with rutile structure are attractive transparent electrodes for photodetectors and overcome the limitations of metal electrodes for Schottky junctions.

A possible alternative are Ultra thin Metal Films (UTMFs) [S. Giurgola, P. Vergani, V. Pruneri "Ultra thin metal films as an alternative to TCOs for optoelectronic applications", Nuovo Cimento B 121, 887-897 (2006); S. Giurgola, A. Rodríguez, L. Martínez, P. Vergani, F. Lucchi, S. Benchabane, V. Pruneri, "Ultra thin nickel transparent electrodes" J. Mater. Sci: Mater. Electron. (2007) [Online publication],], i.e. metal films with a thickness in the range of 2-20 nm. However, given their metallic nature, UTMFs can easily degrade through oxidation, thus changing their electrical and optical properties. In particular this is the case for not noble metallic layers, such as Cr, Ni, Ti and Al.

To avoid oxidation and stability issues ultra thin noble metals have been used as transparent electrodes, such as gold, platinum and palladium but this is an expensive alternative. In addition for some applications one has to search for the metal that provides optimum parameters, e.g. work function or adhesion to specific substrates. It is then in some cases mandatory to use not noble metals.

Thus there still exists the need to provide an alternative method to prepare electrodes with large optical transparency in the wavelength range of interest and adequate electrical conductivity, and showing stability against temperature, mechanical and chemical stress, thus overcoming some of the drawbacks above mentioned.

The solution provided by the present invention is a method that takes actually advantage of the oxidation process to make UTMFs stable against environmental stress. The method consists in a thermal treatment in ambient atmosphere, optionally in combination with an $O_2$ treatment to create a protecting oxide layer on the surface of the UTMFs with a controlled thickness. The method leads to an increase of the electrical resistivity and optical transparency and prevents further oxidation of the metal film underneath the protective oxide layer.

DESCRIPTION OF THE INVENTION

Figure 1:
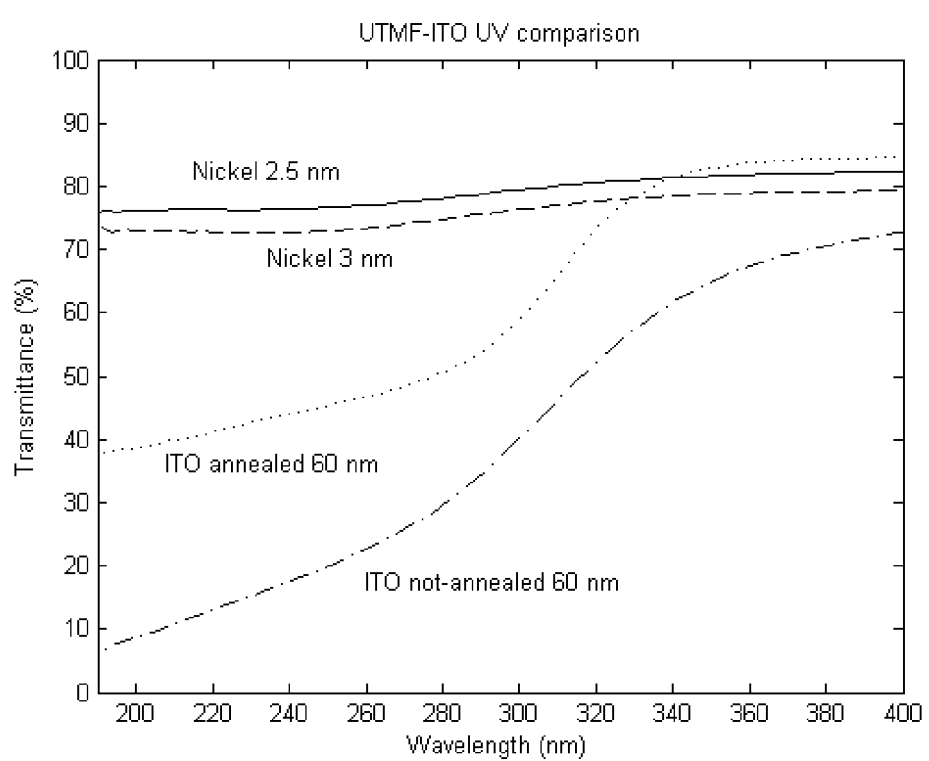
FIG. 1 Ultra-violet transmittance comparison between ITO and UTMFs.

One aspect of the present invention refers to a method to produce a stable ultra thin metal film that comprises the following steps:

a) deposition of the ultra thin metal film on a substrate;
b) thermal treatment of said ultra thin metal film, optionally in combination with an $O_2$ treatment; and
c) obtaining a protective oxide layer on top of the ultra thin metal film.

This method, hereinafter the method of the invention will also be referred to in the description, as passivation process.

In the context of the present invention the expression stable ultra thin metal film refers to an ultra thin metal film (UTMF) which presents no change in electrical resistivity in air at room temperature for at least one month, nor after heat treatment at 90° C. for 2.5 hours in air.

Step a) of the process of the invention may be carried out according to any conventional method. In a particular embodiment, step a) is carried out by sputtering deposition under vacuum [S. Giurgola, P. Vergani, V. Pruneri "Ultra thin metal films as an alternative to TCOs for optoelectronic applications", Nuovo Cimento B 121, 887-897 (2006); S. Giurgola, A. Rodriguez, L. Martinez, P. Vergani, F. Lucchi, S. Benchabane, V. Pruneri, "Ultra thin nickel transparent electrodes" J. Mater. Sci: Mater. Electron. (2007) [Online publication] Link to DOI 10.1007/s10854-007-9519-7.]

This step may be carried out in a conventional sputtering machine (Ketnosistec Dual Chamber DC). In a particular embodiment, the step a) is carried out at room temperature and in pure Ar atmosphere (8 mTorr) and 200 w DC power.

The starting surface roughness of the substrate should preferably be below the thickness of the film, otherwise said film could be discontinuous and thus non-conductive.

Generally the ultra thin metal film deposited in step a) presents a thickness comprised between 3 and 20 nm.

In principle any metal to prepare the thin metal film may be used, but in practice some of them would either not oxidise efficiently (e.g. the noble metals) or be protected by the oxide layer. So as way of an example the following metals, among others, may be mentioned nickel, chromium, aluminium, titanium, and their mixture. In a particular embodiment Ni is used.

The thin layer is deposited on to a substrate said substrate being a dielectric substrate, such as glass, a semiconductor, an inorganic crystal or plastic material. Examples of them are silica ($SiO_2$), borosilicate ($BK_7$), silicon (Si), lithium niobate ($LiNbO_3$), or polyethylene terephthalate (PRT), among others, suitable for putting the invention into practice. Note that substrate refers to the material over which the UTMF is deposited. It can be part of a device structure, e.g. an active semiconductor or organic layer.

According to the method of the invention, the protective oxide layer obtained on top of the thin metal film presents typically a thickness between 0.1 and 4 nm.

Step b) of the method of the invention, is carried out at a temperature usually comprised between 50° C. and 200° C., during typically a few minutes (e.g. 2 minutes or more) to 10 hours, depending on temperature and oxygen ambient.

According to a particular embodiment, for certain crystal cuts of $LiNbO_3$ or any other pyroelectric crystal, heat up and cool down of the sample is preferably carried out slowly during the method of the invention to form the protective layer, so that one avoids formation of pyroelectric charges which could lead to substrate damage or even breakage.

The maximum temperature achieved during treatment is limited to values within which possible alteration and damage of the substrate is prevented, in particular considering also the oxygen environment in which the treatment takes place. These limited values may be easily determined by the skilled person.

In another particular embodiment of the invention step b) comprises an $O_2$ treatment, which may be carried out according to different alternative methods.

Thus, in a particular embodiment, the $O_2$ treatment is carried out in standard atmosphere (about 20% oxygen). In this case temperature is usually comprised between 70 and 200° C.

In another particular embodiment, the $O_2$ treatment is carried out with continuous oxygen flux of 10 to 30 sccm ("standard cubic centimetres per minute"). In this case unionized $O_2$ is used of kinetic energy typically in the range of 100 and 200 eV and at a temperature generally comprised between 50° C. and 120° C.

In a further particular embodiment the $O_2$ treatment is carried out in an oxygen enriched atmosphere, e.g. typically in the presence of >70% oxygen, and at a temperature comprised between 60 and 150° C.

The obtained oxidized UTMF according to the method of the invention is stable and shows larger electrical resistivity and increased optical transparency from the UV (350 nm at least) to infrared (3000 nm at least) when compared to the situation measured straight after metal deposition.

Figure 2:
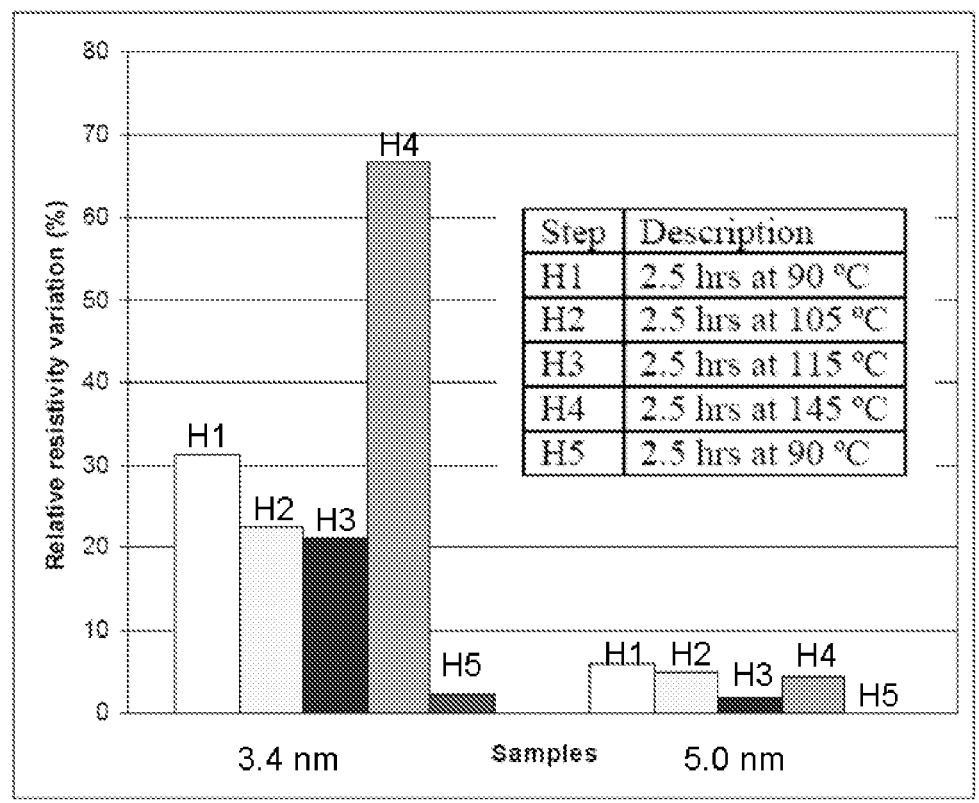
FIG. 2 shows the electrical resistivity variation of a 3.4 and 5.0 nanometers ultra thin metal film as a function of the method of the invention comprising different steps carried out sequentially on the same ultra thin metal film sample.

According to a particular embodiment of the invention, the thermal treatment of step b) comprises steps H1, to H5 as defined in FIG. 2. FIG. 2 shows the resistivity variation after each of the steps referred to as H1, H2, H3, H4 and H5, and is given with respect to the previous step. For H1 the resistivity variation is given with respect to the resistivity of the deposited film, kept at room temperature in ambient atmosphere for 12 days.

Thus, inventors have shown that after the method of the invention is applied to a UTMF deposited on a substrate, the electrical resistivity of films with thickness equal or greater than 3 nm does not change significantly for annealing temperatures equal or lower than 90° C. In the case of film thickness equal or greater than 5 nm, the electrical resistivity does not change significantly for even higher temperatures already after step H1.

As consequence of applying the method of the invention to an UTMF, partial oxidation of the metal film occurs. This is confirmed by elemental analysis techniques as for example Energy Dispersive X-ray analysis (EDX): response spectra of treated samples show the presence of oxygen besides the one of the metal element. The concentration ratio of Ni and $O_2$ depends on the thickness of the film and on the oxide compounds formed. Oxidation is also indirectly confirmed by a thickness change of the film, since film thickness increases due to the formation of an oxide compound on top of the film. This oxidized layer reduces the effective metal thickness, but—at the same time—contributes to make the film stable acting as a protection layer and preventing from further oxidation of the film.

Figure 3:
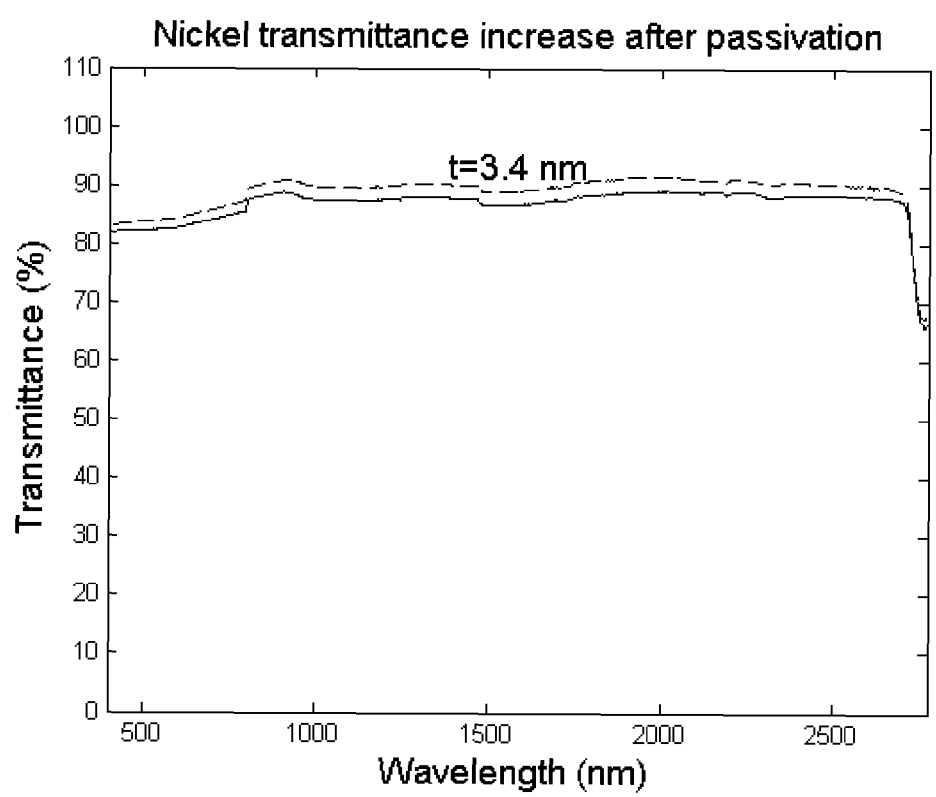
FIG. 3 shows the optical transmittance of a 3.4 nanometers nickel ultra thin metal film before and after the method of the invention (H1 to H5 as defined in FIG. 2).

As a result of the passivation process, the electrical resistivity of the so obtained protected UTMF is higher than that of the originally deposited film. At the same time, the transmittance of the film is also increased for all the wavelengths measured, from infrared to ultraviolet. In this sense the optical transmittance measurements of both films as deposited and after treatment films are shown in FIG. 3. These were obtained using a Perkin Elmer Lambda 950 spectrometer.

In view of the above exposed it can be seen that the method of the present invention presents the important advantage of providing stable and transparent conductive electrodes which find many applications due to their simple and low cost method of fabrication and their intrinsic technical characteristics. In this sense it is known that in devices such as photovoltaic cells, organic light emitting, integrated electro-optic modulators, lasers and photo-detectors, transparent conductive electrodes are key elements, and are combined with other materials. The stability of the electrodes obtained according to the method of the invention is of outmost importance to maintain the performance of the devices over time, in particular under demanding and changing environmental conditions. In addition since during the fabrication process, after the transparent conductive electrode is deposited, subsequent processing (e.g. those required to complete the device structure) can alter significantly the electrodes properties, the stable electrodes prepared according to the present method are also very interesting from this point of view.

The foregoing is illustrative of the present invention. This invention however is not limited to the following precise embodiments described herein, but encompasses all equivalent modifications within the scope of the claims which follow.

EXAMPLES

Example 1

Method, Ni-UTMF Obtained and its Characterization

A 3.4 nanometers thick nickel ultrathin metal film was deposited on a double-side polished BK7 substrate using an ATC ORION 3 HV Sputtering DC System. The sputtering process was performed at room temperature in a pure argon (Ar) atmosphere. Argon pressure was set to 8 mTorr and 200 W DC power electric field was used.

The electrical resistivity of the film at room temperature was measured straight after deposition and twelve days after the film was deposited, always being kept in ambient atmosphere. A Cascade Microtech 44/7S Four Point Probe and a Keithley 2001 multimeter were used for measuring sheet resistance. The sheet resistance ($R_s$), i.e. the resistance of a square like sheet of layer, is measured in $\Omega$/ and is related to the electrical resistivity ($\rho$) measured in $\Omega \cdot m$ through the following relation: $R_s = \rho/t$ with t the thickness of the layer in m. The resistivity of the layer was thus obtained as the ratio between sheet resistance and film's thickness. The resistivity during this 12 days period increased significantly (about 60% increase), showing that the ultra thin metal film is not stable if no additional treatment is carried out once the nickel is deposited.

Twelve days after deposition, the film kept at room temperature in ambient atmosphere, a first thermal treatment, H1 (90° C. for 2.5 hrs) was applied in ambient atmosphere inside a Selecta Hightemp 2001406 oven. Temperature was measured using a Fluke thermometer 52 II. After this initial treatment the film showed a change in resistivity (about 30% increase). Further treatments, H2 to H4, were then applied to the film (FIG. 2). The electrical resistivity did not remain constant and increased after each thermal treatment.

A final step (H5) was carried out to test whether the ultra thin metal film obtained after H1, H2, H3 and H4 was stable or not, according to the definition of stable aforementioned. After H5, as it can be observed in FIG. 2, the electrical resistivity change is negligible (about 2%), and thus the ultra thin metal film after the thermal treatment performed was considered stable.

Example 2

Method, Ni-UTMF Obtained and its Characterization

The method of the invention comprised depositing on a substrate a 6 nanometers thick nickel ultrathin metal film. The film was grown on a double-side polished BK7 substrate using an ATC ORION 3 HV Sputtering DC System. The sputtering process was performed at room temperature in a pure argon (Ar) atmosphere. Argon pressure was set to 8 mTorr and 200 W DC power electric field was used.

The electrical resistivity and the optical transmittance of the film are then measured as it is described in the previous example.

The film undergoes a thermal treatment at about 120° C. and is subjected to a continuous neutral (unionized) oxygen flux of about 20 sccm with kinetic energy of about 130 eV. After about 10 minutes, from electrical resistivity measurements and thickness change measurements, it was found that the formed oxide thickness was about 2.5 nm.

The Ni-UTMF so obtained was stable.

What is claimed is:

1. A method for producing a stable transparent electrode comprising:
    a) deposition of an ultra thin metal film directly on a substrate;
    b) thermal treatment of said ultra thin metal film in the presence of a continuous $O_2$ flux of 10 to 30 standard cubic centimeters per minute of unionized $O_2$ of kinetic energy in the range of 100 and 200 eV at a temperature in the range of 50° C. to 120° C.; and
    c) obtaining thereby a protective oxide layer on top of said ultra thin metal film.

2. A method according to claim 1, wherein the ultra thin metal film deposited in step a) is between 3 and 20 nanometres thick.

3. A method according to claim 1, wherein said metal of said ultra thin metal film is selected from a group consisting of nickel, chromium, aluminium, titanium and their mixture.

4. A method according to claim 1, wherein said substrate is a dielectric substrate, selected from a group consisting of glass, a semiconductor, an organic material and an inorganic crystal.

5. A method according to claim 4, wherein said substrate is selected from a group consisting of silica ($SiO_2$), borosilicate ($BK_7$), silicon (Si), polyethylene terephthalate (PRT) and lithium niobate ($LiNbO_3$).

6. A method according to claim 1, wherein said protective oxide layer is between 0.1 and 4 nanometres thick.

7. A method according to claim 1, wherein step b) is carried out at a temperature in the range 50° C. to 200° C.

8. A method according to claim 1, wherein step b) is carried out for a period of time falling in the range 2 minutes to 10 hours.

9. A method according to claim 1, wherein step b) further comprises an $O_2$ treatment, which is carried out in standard atmosphere at a temperature falling in the range 70° C. to 200° C.

10. A method according to claim 1, wherein step b) further comprises an $O_2$ treatment, which is carried out in an oxygen enriched atmosphere that includes more than 70% oxygen content in a temperature range 60° C. to 150° C.

11. A method for producing a stable transparent electrode comprising:
   a) deposition of an ultra thin metal film directly on a substrate;
   b) thermal treatment of said ultra thin metal film in the presence of $O_2$; and
   c) obtaining thereby a protective oxide layer on top of said ultra thin metal film wherein the thermal treatment of step b) comprises the following steps:
      wherein step b) is carried out at 120° C., during 10 minutes and in the presence of a continuous neutral oxygen flux of 20 sccm with kinetic energy of 130 eV.

12. A method according to claim 11, wherein the ultra thin metal film deposited in step a) is between 3 and 20 nanometres thick.

13. A method according to claim 11, wherein said protective oxide layer is between 0.1 and 4 nanometres thick.

14. A method for producing a stable transparent electrode comprising:
   a) deposition of an ultra thin metal film directly on a substrate;
   b) thermal treatment of said ultra thin metal film in the presence of $O_2$; and
   c) obtaining thereby a protective oxide layer on top of said ultra thin metal film wherein the thermal treatment of step b) comprises the following steps:
   H1 2.5 hours at 90° C.;
   H2 2.5 hours at 105° C.;
   H3 2.5 hours at 115° C.;
   H4 2.5 hours at 145° C.; and
   H5 2.5 hours at 90° C.

15. A method according to claim 14, wherein the ultra thin metal film deposited in step a) is between 3 and 20 nanometres thick.

16. A method according to claim 14, wherein said protective oxide layer is between 0.1 and 4 nanometres thick.

* * * * *

UNITED STATES PATENT AND TRADEMARK OFFICE
CERTIFICATE OF CORRECTION

| | | |
|---|---|---|
| PATENT NO. | : 8,623,153 B2 | Page 1 of 1 |
| APPLICATION NO. | : 12/997011 | |
| DATED | : January 7, 2014 | |
| INVENTOR(S) | : Valerio Pruneri et al. | |

It is certified that error appears in the above-identified patent and that said Letters Patent is hereby corrected as shown below:

Title page, item (75) should read as follows:

(75) Inventors: Valerio Pruneri, Barcelona (ES);
Luis Martinez Montblanch, Barcelona (ES);
Stefano Giurgola, Sesto Fiorentino (IT);
Paolo Vergani, Vimercate (IT)

Signed and Sealed this
Twenty-fifth Day of February, 2014

Michelle K. Lee
*Deputy Director of the United States Patent and Trademark Office*